(12) United States Patent  
Oksanen et al.

(10) Patent No.: US 8,447,715 B2  
(45) Date of Patent: May 21, 2013

(54) APPARATUS AND ASSOCIATED METHODS IN RELATION TO CARBON NANOTUBE NETWORKS

(75) Inventors: Markku Anttoni Oksanen, Helsinki (FI); Eira Seppälä, Helsinki (FI); Vladmir Ermolov, Espoo (FI); Pirjo Pasanen, Vantaa (FI)

(73) Assignee: Nokia Corporation, Espoo (FI)

( * ) Notice: Subject to any disclaimer, the term of this patent is extended or adjusted under 35 U.S.C. 154(b) by 882 days.

(21) Appl. No.: 12/484,036

(22) Filed: Jun. 12, 2009

(65) Prior Publication Data

US 2010/0315153 A1    Dec. 16, 2010

(51) Int. Cl.  
*G06F 17/00* (2006.01)

(52) U.S. Cl.  
USPC ............................................ 706/45; 977/902

(58) Field of Classification Search  
None  
See application file for complete search history.

(56) References Cited

U.S. PATENT DOCUMENTS

| 6,128,214 | A | 10/2000 | Kuekes et al. |
| 2002/0174288 | A1 | 11/2002 | Lincoln ............ 711/103 |
| 2003/0058697 | A1 | 3/2003 | Tour et al. ......... 365/200 |
| 2003/0236760 | A1 | 12/2003 | Nugent |
| 2004/0193558 | A1 | 9/2004 | Nugent ............. 706/25 |
| 2007/0128744 | A1 | 6/2007 | Tour et al. ......... 438/22 |
| 2009/0043722 | A1 | 2/2009 | Nugent |
| 2010/0143582 | A1* | 6/2010 | Lieber et al. ........ 427/98.4 |

FOREIGN PATENT DOCUMENTS

WO    WO-2009/013754    1/2009

OTHER PUBLICATIONS

Bush et al. "Graph Spectra of Carbon Nanotube Networks", 1$^{st}$ International Conference on Nano-Networks and Workshops—NanoNet '06, pp. 1-10, Sep. 2006.  
Balberg, I., et al. "Excluded Volume and its Relation to the Onset of Percolation." Physical Review B, vol. 30, No. 7, Oct. 1, 1984, pp. 3933-3943.  
http://en.wikipedia.org/wiki/physically_unclonable_function, Nov. 3, 2009.  
http://javacard.vetilles.com/2008/11/25/physical-unclonable-functions/.  
http://www.freshpatents.com/Method-and-apparatus-for-detection-of-a-speckle-based-physically-unclnable-function-dt20070426ptan20070090312.php, 2007.  
http://www.nanotech.net/content/conference/themes/electronics/carbon-nanomaterials-nanoelectronics-1/low-cost-electronics-ba.

(Continued)

*Primary Examiner* — Alan Chen  
(74) *Attorney, Agent, or Firm* — Harrington & Smith

(57) ABSTRACT

In one or more embodiments described herein, there is provided an apparatus comprising a substrate, and a plurality of carbon nanotubes (semiconducting nano-elements) disposed and fixed with said substrate. The nanotubes are disposed and fixed on said substrate such that they define a carbon nanotube network substantially at the percolation threshold of the network. As the network is at the percolation threshold, this provides for one or more signal paths extending from an input region to an output region. The apparatus is configured to, upon receiving particular input signalling via the input region, provide particular predefined output signalling at the output via the one or more signal paths, the particular output signalling being predefined according to the one or more one signal paths.

10 Claims, 15 Drawing Sheets

OTHER PUBLICATIONS

Provatas, N., et al. "Growth, Percolation, and Correlations in Disordered Fiber Networks." Journal of Statistical Physics, vol. 87, Nos. 1/2, 1997, pp. 385-413.

Stanley, H. Eugene. "Cluster Shapes at the Percolation Threshold: An Effective Cluster Dimensionality and its Connection with Critical-Point Exponents." J. Phys. A: Math. Gen., vol. 10, No. 11, 1977, pp. L211-L220.

Stauffer, D., et al. "Introduction to Percolation Theory." (Taylor & Francis, London, 1991).

Zavodchikova, M., et al. "Novel Carbon Nanotube Network Deposition Tecnique for Electronic Device Fabrication." Phys. Stat. Sol. (b),2008, pp. 1-4.

* cited by examiner

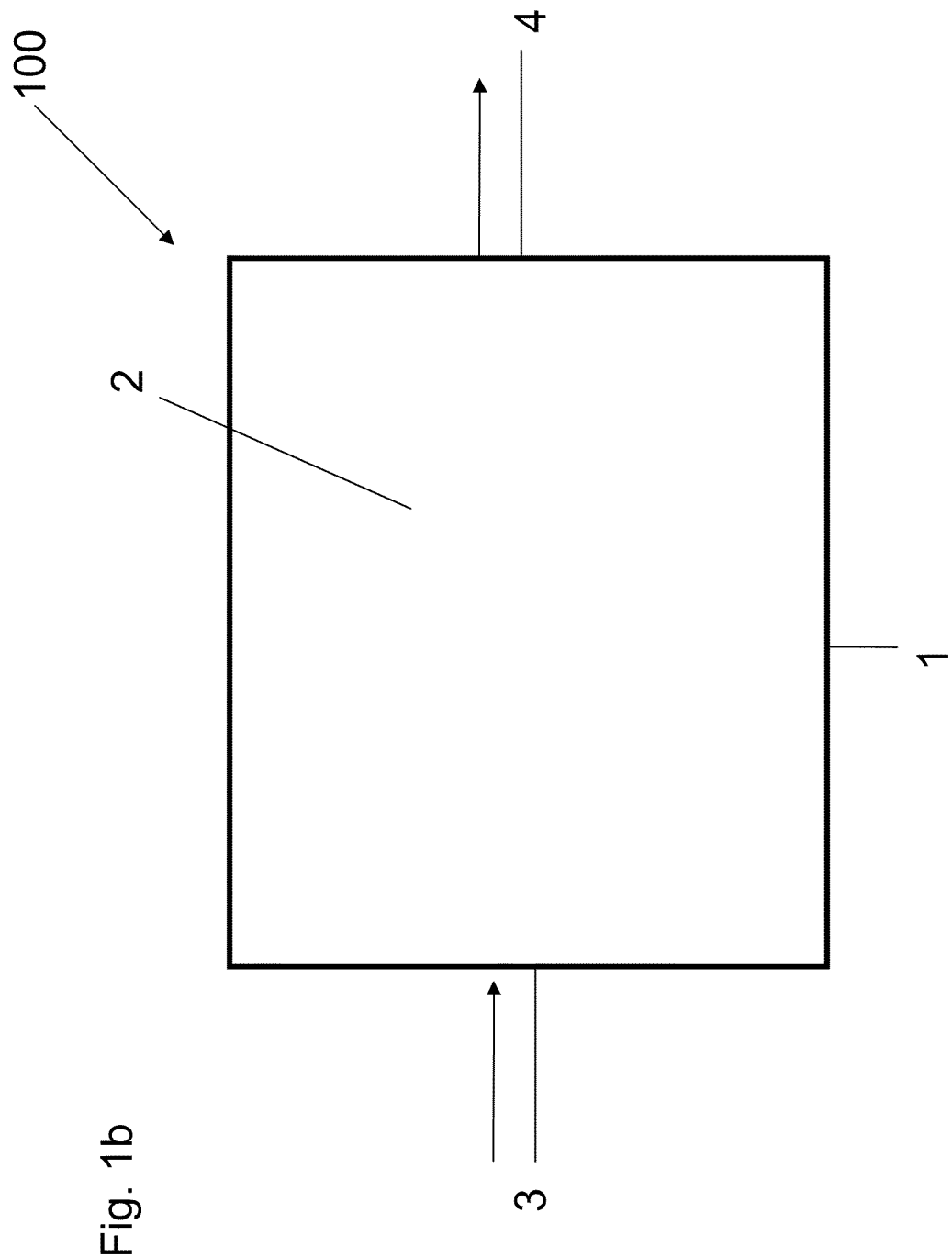

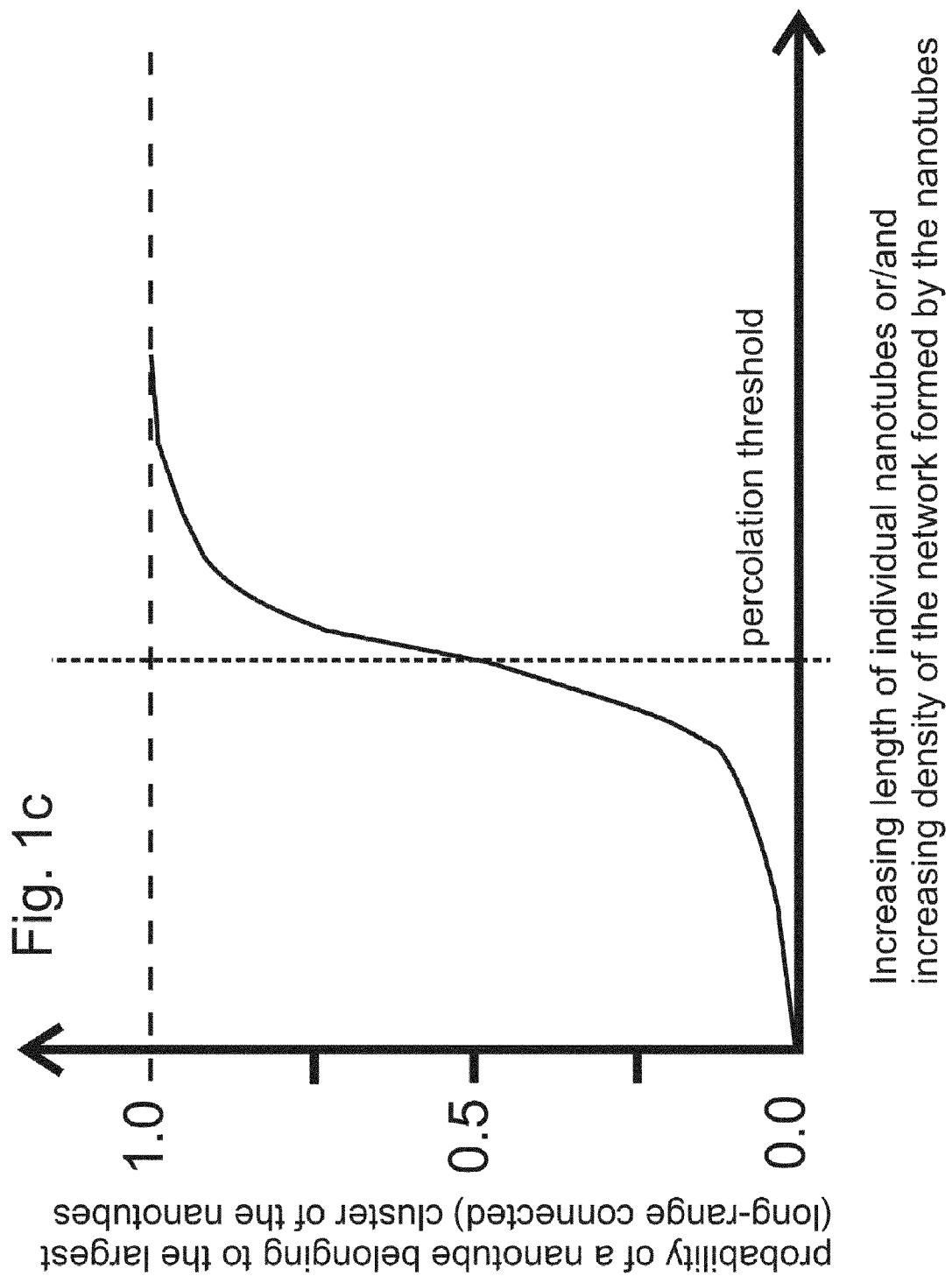

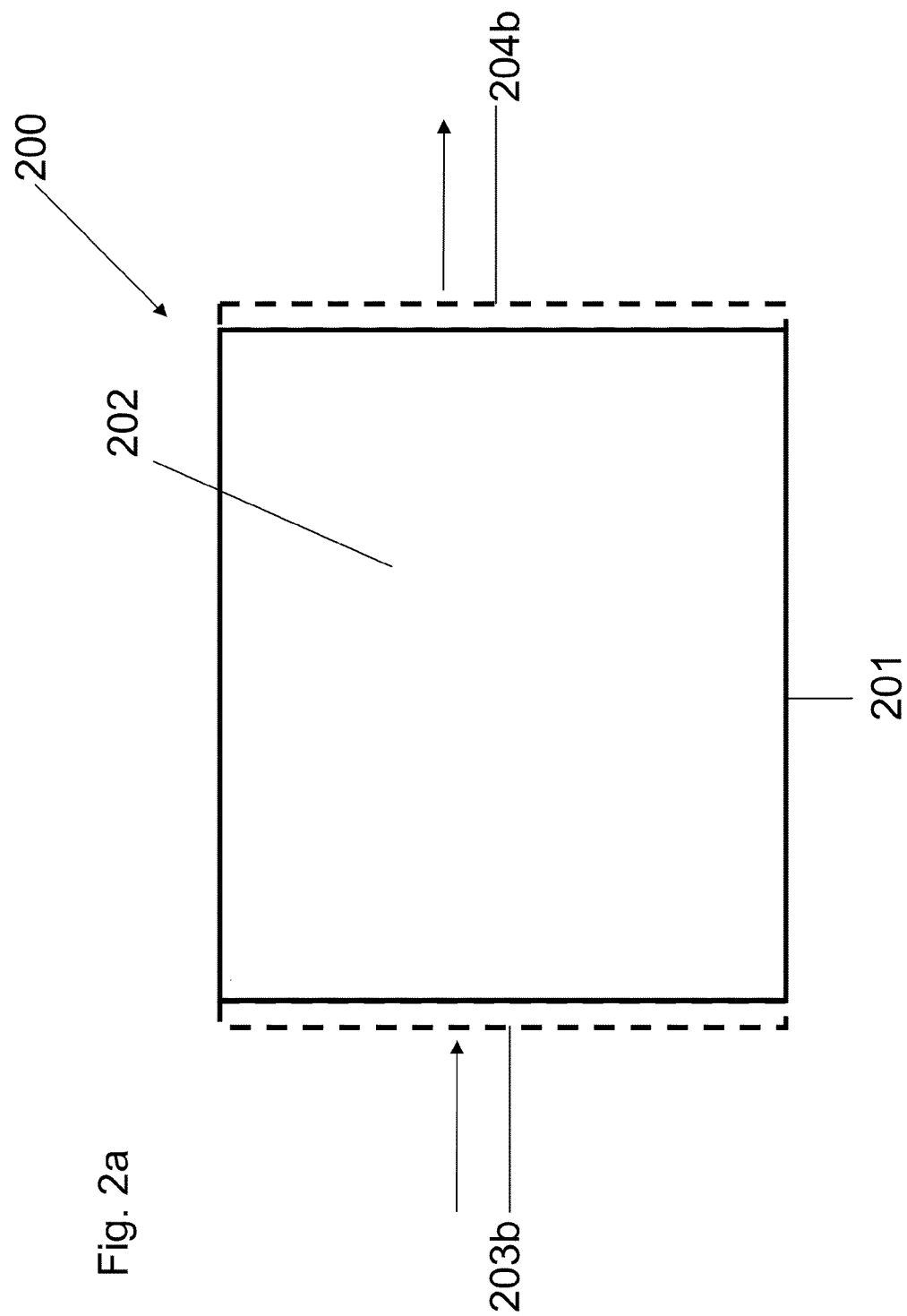

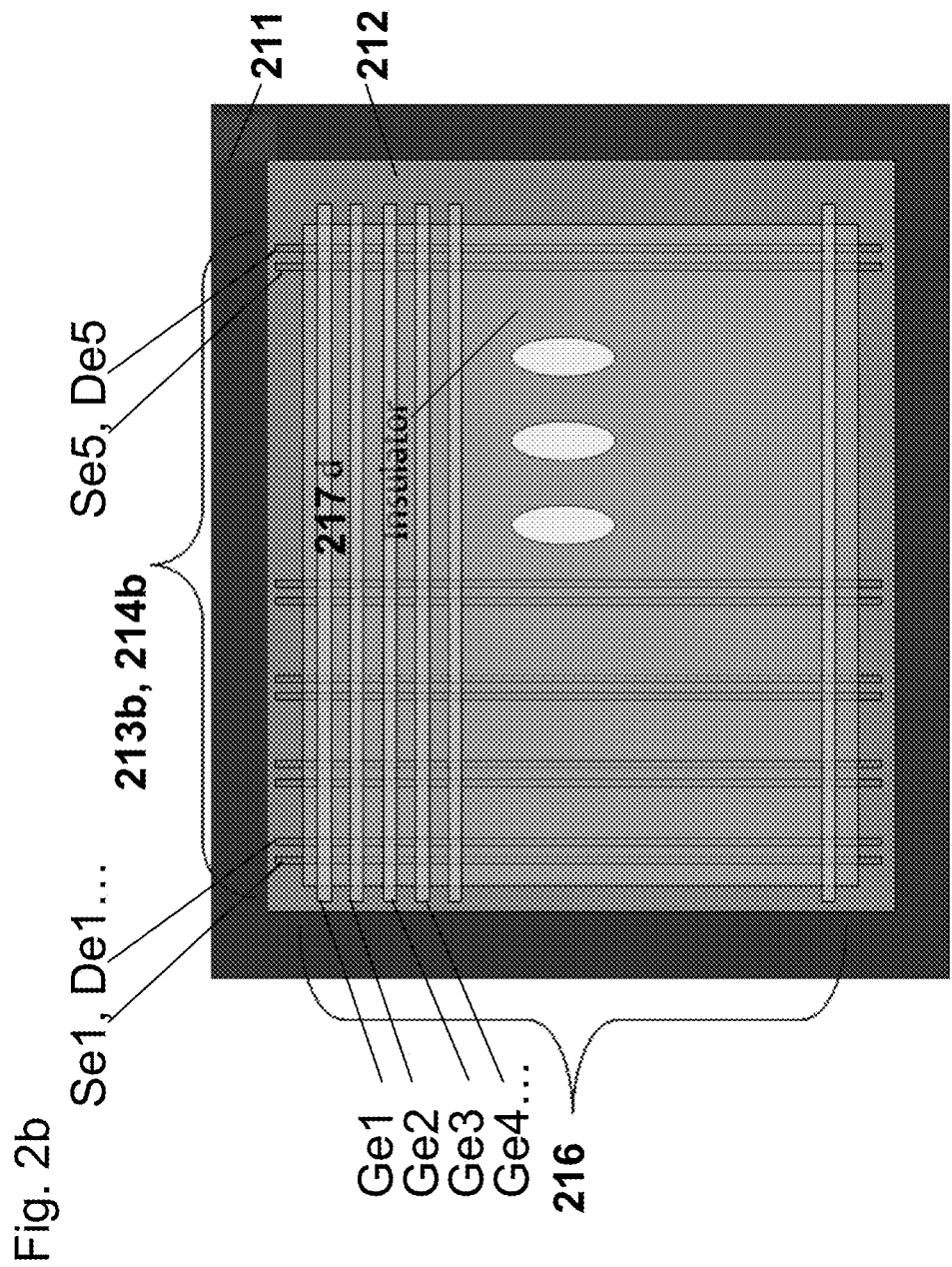

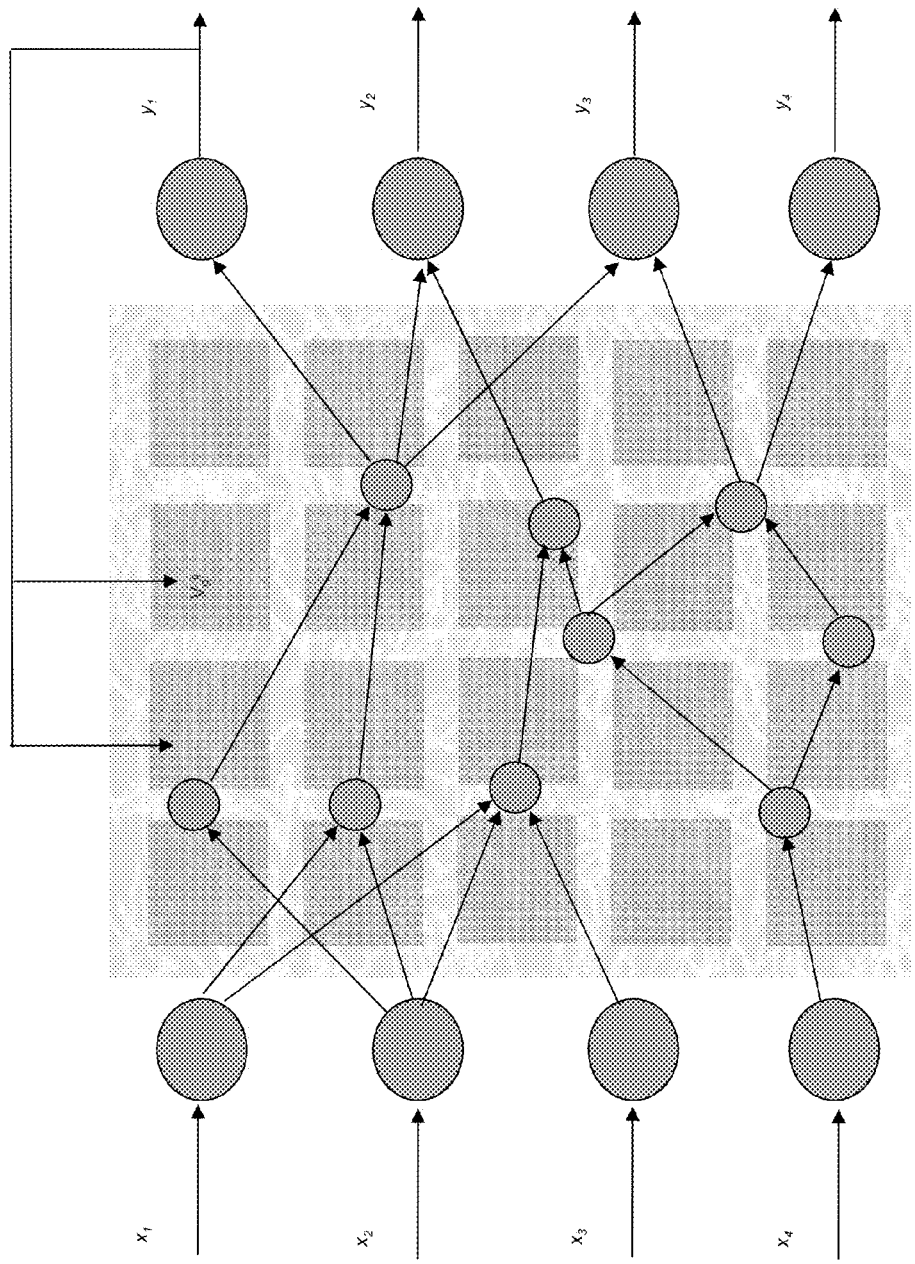

Top gate structure

Bottom gate structure

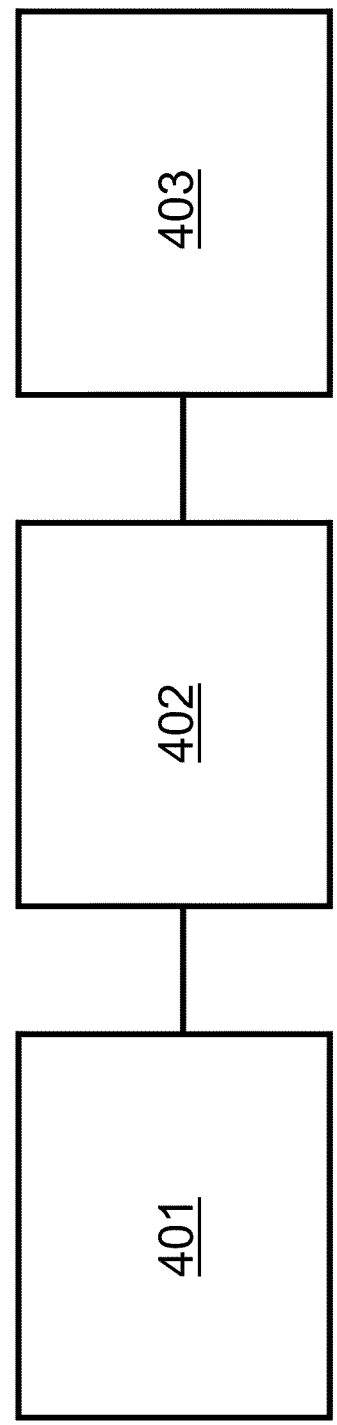

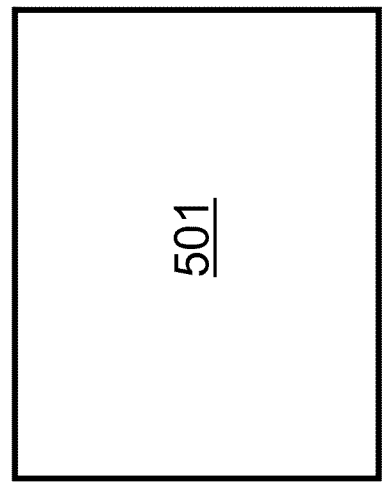

APPARATUS AND ASSOCIATED METHODS IN RELATION TO CARBON NANOTUBE NETWORKS

TECHNICAL FIELD

The present disclosure relates to the field of carbon nanotube networks and methods, computer programs and apparatus associated with such networks. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. telecommunication, video-communication, and/or text transmission (Short Message Service (SMS)/Multimedia Message Service (MMS)/emailing) functions), interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

A problem that occurs when trying to achieve nano-computing systems is to find system architectures that can be manufactured in practice. For example, manufacturing of nanoscale components is inherently unreliable and leads to large amounts of failed and poorly functioning devices. The architecture, the computing logic and the algorithms of such devices need to take this into account, and to be able to compensate for this unreliability somehow.

At present there are two basic options on how to solve this: try to improve hardware reliability by some means (e.g. via manufacturing process, redundant components), or to use software that can deal with unreliable hardware (e.g. via error correction, dynamic reconfiguration of hardware, robust algorithms or computing principles, like neural networks or any other machine learning algorithms capable of learning or being taught). Unfortunately, there is always a trade-off between hardware and software complexity: with simple software the hardware has to be very reliable, and with unreliable hardware the software required can be extensively complex.

One data processing device architecture that has been broadly used outside nano-scale implementation is the cross-bar architecture. Cross-bar structures have been proposed in U.S. Pat. No. 6,128,214 "Molecular wire cross-bar memory", with certain types of binary state molecules in between, which can be tune on or off by applying voltage across the nanowires. Also, papers by Likharev cover similar ideas in devices that utilise neural networks. Furthermore, US20030236760 "Multi-layer training in a physical neural network formed using nanotechnology" and US2009/0043722 A1 "Adaptive neural network utilizing nanotechnology-based components" describe a neural-network type information processing devices utilizing nanoparticles. The devices described in this document consists of a cross-bar structure, with nanoparticles diluted in a solvent in between the top and bottom parts of the sandwiched structure.

WO 2009/013754 "Chemically sensitive field effect transistors and use thereof for electronic nose devices" describes how to use silicon nanowire field effect transistors (FETs) as chemical sensors, in conjunction with pattern recognition algorithms to detect the sensed chemicals. Here the pattern recognition algorithms are implemented in traditional CMOS devices This same structure has been proposed for nano-implementation. The idea is that by crossing nanowires and functionalizing the crosspoint somehow with suitable molecules one can get a two-terminal transistor, which can be turned on and off by applying voltage to the wires. But there is still a problem that the system needs to interface at the microscale, so microscale connections to the nanowires are needed.

However, as stated above, this is difficult to do. Manufacturing can become complicated, and there are often losses due to poor contacts. In particular, the operation of the molecules in the cross-points is very limited, and only simple operations can be realized. There are also proposals of using cross-bar structures to perform Boolean computing (i.e. as FPGA processors) and as neural networks. With FPGA, the problem comes with the very large area required to construct even a simple circuit. The neural network-type systems suffer from the fact that (due to the cross-bar structure) the number of connections between the different logic gates or "neurons" are quite limited, which reduces the computing capability of the system. The number can be enhanced by adding microscale wires on top, but this complicates the manufacturing process. Due to the complications mentioned, no functioning cross-bar circuits have been demonstrated to date.

Another problem comes with effective analysis of sensory data. Nanoscale sensor elements have been fabricated from many materials, but the data needs to be analysed somehow to extract relevant features. Digital CMOS does not provide the best way of doing this, since it requires analog-to digital conversions, and can thus be very energy consuming compared to the energy used by the nanoscale sensor, particularly when the sensor data is very complex as its analysis can require a lot of processing.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

In a first aspect, there is provided an apparatus comprising:
a substrate;
a plurality of carbon nanotubes disposed and fixed with said substrate to define a carbon nanotube network substantially at the percolation threshold of the network, wherein the percolation threshold provides for one or more paths extending from an input region to an output region of the network,
the apparatus being configured to, upon receiving particular input signalling via the input region, provide particular predefined output signalling at the output via the one or more signal paths, the particular output signalling being predefined according to the one or more one signal paths.

The carbon nanotubes of the network may be disposed on a (one or more) substrate(s), e.g. adhered to the top of a silicon substrate/substratum. It is simple, easy and straightforward to apply nanotubes on to existing structures/materials using this method. Alternatively, the nanotubes may be disposed within an equivalent insulating/non-conductive/semiconductor material substrate, e.g. suspended in an epoxy, epoxy resin, or other such material. Impregnating the network within such materials can thereby provide additional strength, support and robustness to the network.

The carbon nanotubes may be disposed randomly on said substrate to define said network. Thereby, the particular predefined output signalling may comprise unique output signalling provided by virtue of the random distribution of the carbon nanotube network.

The apparatus may provide, via the random disposition of the network and unique output signalling, an apparatus that can act as a physically unclonable function. This may be by virtue of its nanoscale (inherent in the size of carbon nanotubes) size network, and/or the difficulty inherent in replicating such structures (random, ordered, or otherwise) accurately on the nanoscale.

The input region may be configured to receive an inputted challenge signal (as per a challenge-response pair in physically unclonable functions) and the output may be configured to provide the resultant response signal in reaction to the inputted challenge signal, the inputted challenge signal being altered by the signal path or paths of the carbon nanotube network.

The apparatus may further comprise one or more gates configured to be in electrical communication with the carbon nanotube network disposed on the substrate, the apparatus also being configured to be capable of applying bias to one or more of said gates to alter the electrical properties of the carbon nanotube network to provide particular predefined output signalling according to the respective bias applied to one or more of the gates.

The apparatus may further comprise one or more input connections and one or more output connections, the input and output connections each being respectively configured to be in electrical communication with the input and output regions of the carbon nanotube network, the one or more signal paths of the network being configured to extend between respective input connections and corresponding output connections, the apparatus being configured to, upon receiving particular input signalling via one or more of the input connections, provide particular predefined output signalling at one or more of the corresponding output connections connected via the one or more signal paths, the particular output signalling being predefined according to the one or more signal paths connecting the respective input connections and corresponding output connections.

The one or more of the signal paths may be respectively configured to provide one or more corresponding functions, the particular output signalling being predefined according to the one or more functions provided by the one or more respective signal paths.

Each of the functions may be selected from a list of analog functions, or digital/logic functions, or a combination of the two.

The analog functions may be any mathematically describable function involving the inputs. For example, the functions may be represented mathematically by: $x^n$, $+n$, $-n$, $/n$, $\times n$, etc, or any combination thereof (where n is any real or imaginary number, integer or otherwise). The analog functions may correspond to a solution of a mathematical problem or operation of a computational or mathematical model or algorithm. For example, the functions may act on input signalling to calculate a Fourier transform, or an integration/differentiation calculation, etc. The mathematical operation may also utilise mathematical operations that involve one or more different components of the input signalling, e.g. $S1/S2$, $S1 \times S2$, $S1+S2$, etc, where S1 is a first component and S2 is a second component of the input signalling.

The logic functions provided may be selected from the list of: AND, OR, XOR, NOR, NOT, or any combination thereof. The logic functions may also be a simple 'YES' connection to allow signals to pass unaffected, or a 'NO' connection which does not allow signals to pass through the path providing this function.

The apparatus may also be configured to be capable of applying bias to one or more of said gates to alter the electrical properties of the carbon nanotube network to thereby configure/reconfigure one or more paths to provide one or more respective functions, the particular predefined output signalling being predefined according to the one or more provided/reconfigured functions.

The apparatus may also be configured to be capable of selectively switching/altering the bias applied to any one or more of the gates to cause the function provided by any one or more of the corresponding signal paths to be switched from a first function to a second logic function, wherein the second function is different from the first function.

The gates may be configured to be switchable from a second function to a further function. The gates may be configured to be rapidly switched from one function to another. A function provided by one or more of the signal paths may comprise two or more functions that operate differently on distinct signalling. For example, a given signal path may perform one function on a first component of the input signalling, whilst the same signal path may perform a second different function on a second component of the input signalling. For example, a high frequency component of input signalling may experience a first (e.g. AND) function across a given signal path, whilst a low frequency component of the input signalling may experience a different (e.g. OR) function across the same signal path. The operation of these functions may occur in sequence, simultaneously, or they may temporally overlap one another.

The apparatus may be configured to be capable of controlling the one or more gates to configure itself as an application specific integrated circuit (ASIC).

The apparatus may also comprise a processor electrically connected to one or more of the gates, the input region and the output region, wherein the processor is provided with a learning algorithm configured to be able to perform the method of:
  detecting logic functions provided by one or more signal paths of the network,
  calculating the applied bias needed to provide/configure/reconfigure one or more of the signal paths to provide one or more desired logic functions, and
  applying the necessary bias to the corresponding gates to configure the respective one or more signal paths to provide the one or more desired logic functions.

The apparatus may also comprise adaptive learning circuitry that is configured to be able to actively tune the functions and functionality provided by the network based on desired parameters. For example, a user/manufacturer may desire the apparatus to perform a specific intended purpose. In one embodiment, by inputting the desired function of the apparatus into the adaptive learning circuitry, the circuitry may, by changing the applied bias, alter the functions provided by the network to achieve an apparatus whose paths provides the necessary functions to achieve the intended purpose for the chip, e.g. a 555 timing chip, standard ICs, a calculator, a CPU for a computer, a sensor chip for a sensing device (e.g. detecting chemicals, smells, images, etc), a pattern recognition chip for such devices (a chip that can identify or recognise patterns in provided input signalling), or even a data classification chip for such devices (a chip that can sort/order/classify data provided via the input signalling), etc.

According to a further aspect, there is provided a radio frequency identification tag comprising the apparatus of the first aspect, wherein the input region is electrically connected to an input antenna, and the output region is electrically connected to an output antenna, the radio frequency identification tag being configured to, upon receiving particular input signalling via the input antenna, provide unique particular predefined output signalling via the output antenna.

According to a further aspect, there is provided a nano-scale processor comprising the apparatus of the first aspect.

According to a further aspect, there is provided a transistor comprising the apparatus of the first aspect, wherein the input region acts as a source, the output region acts as a drain, and the network together with the substrate acts as a semiconductor material provided between the source and the drain.

The transistor may be a crossbar structure transistor.

In a further aspect, there is provided an apparatus comprising:
  means for receiving a network of means for conduction on the nano-scale; and
  means for conduction on the nano-scale, said means for conduction disposed and fixed with said means for receiving a network of means for conduction to define a network of means for conduction on the nano-scale that it is at the percolation threshold of the network, wherein the percolation threshold provides for one or more paths extending from a means for inputting to a means for outputting of the network,
  the apparatus being configured to, upon receiving particular input signalling via the means for inputting, provide particular predefined output signalling at the means for outputting via the one or more signal paths, the particular output signalling being predefined according to the one or more one signal paths.

According to a further aspect, there is provided a method for assembling an apparatus, the apparatus comprising:
  a substrate;
  a plurality of carbon nanotubes disposed and fixed with said substrate to define a carbon nanotube network substantially at the percolation threshold of the network, wherein the percolation threshold provides for one or more paths extending from an input region to an output region of the network,
  the apparatus being configured to, upon receiving particular input signalling via the input region, provide particular predefined output signalling at the output via the one or more signal paths, the particular output signalling being predefined according to the one or more one signal paths, wherein the method comprises:
  disposing the plurality of the carbon nanotubes with the substrate such that the network is substantially at its percolation threshold, the percolation threshold thereby providing for the one or more paths extending from the input region to the output region.

The step of disposing the carbon nanotubes may also comprise disposing the nanotubes randomly on said substrate to define said network, such that particular predefined output signalling comprises unique output signalling provided by virtue of the random distribution of the carbon nanotube network.

The method of assembly may also comprise the step of providing one or more gates such that they are in electrical communication with the carbon nanotube network disposed on the substrate.

According to a further aspect, there is provided a method for configuring an apparatus, the apparatus comprising:
  a substrate;
  a plurality of carbon nanotubes disposed and fixed with said substrate to define a carbon nanotube network substantially at the percolation threshold of the network, wherein the percolation threshold provides for one or more paths extending from an input region to an output region,
  the apparatus being configured to, upon receiving particular input signalling via the input region, provide particular predefined output signalling at the output via the one or more signal paths, the particular output signalling being predefined according to the one or more one signal paths; wherein the method comprises:
  detecting logic functions provided by one or more signal paths of the network,
  calculating the applied bias needed to provide/configure/reconfigure one or more of the signal paths to provide one or more desired logic functions, and
  applying the necessary bias to the corresponding gates to configure the respective one or more signal paths to provide the one or more desired logic functions.

According to the method aspect immediately above, there is provided a computer readable medium comprising computer code configured to perform the method of the aspect immediately above, when run on a processor comprised by the apparatus.

According to a further aspect, there is provided an apparatus comprising:
  a substrate;
  a plurality of semiconducting nano-elements disposed and fixed with said substrate to define a semiconducting network of nano-elements substantially at the percolation threshold of the network, wherein the percolation threshold provides for one or more paths extending from an input region to an output region of the network,
  the apparatus being configured to, upon receiving particular input signalling via the input region, provide particular predefined output signalling at the output via the one or more signal paths, the particular output signalling being predefined according to the one or more one signal paths.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described embodiments.

The above summary is intended to be merely exemplary and non-limiting.

BRIEF DESCRIPTION OF THE FIGURES

A description is now given, by way of example only, with reference to the accompanying drawings, in which:

FIG. 1b shows a top-down schematic view of the substrate of FIG. 1a.

FIG. 1c shows a graph illustrating the nature of the percolation threshold of a given network formed by a given number of paths with a given length, the network having a given density.

FIG. 1d shows a photo of such a substrate as depicted in FIG. 1a.

FIG. 2a shows a top-down schematic view of a first embodiment utilising the substrate of FIG. 1a.

FIG. 2b shows a variation of the first embodiment utilising a crossbar structure transistor.

FIG. 3a shows a top-down schematic view of a second embodiment utilising the substrate of FIG. 1a.

FIG. 3d shows a further representation of the mapping of the logical structure (or the computational model) of the apparatus and paths through the network of the second embodiment.

FIG. 4 shows a flowchart illustrating the method of tuning the gates in the second embodiment.

FIG. 5 shows a flowchart illustrating the method of assembly of the substrate.

DESCRIPTION OF SPECIFIC ASPECTS/EMBODIMENTS

Figure 1A:
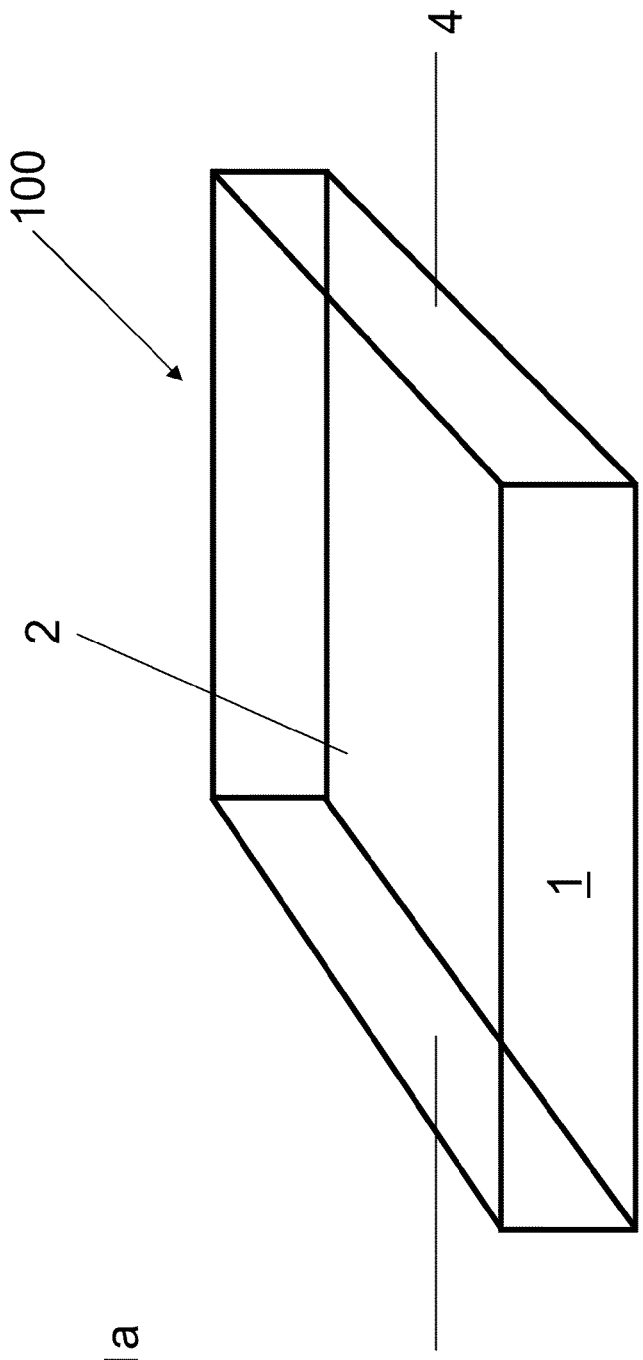
FIG. 1a shows an isometric view of a substrate having a carbon nanotube network fixedly disposed with the substrate as used in several embodiments of the invention.

In one or more embodiments described herein, there is provided an apparatus comprising a substrate, and a plurality of carbon nanotubes disposed and fixed with said substrate. The nanotubes are disposed and fixed on said substrate such that they define a carbon nanotube network substantially at the percolation threshold of the network. As the network is at the percolation threshold, this provides for one or more signal paths extending from an input region to an output region of the network. The apparatus is configured to, upon receiving particular input signalling via the input region, provide particular predefined output signalling at the output via the one or more signal paths, the particular output signalling being predefined according to the one or more one signal paths. This provides for a series of signal paths on the order of nanometres by virtue of the scale and properties of the carbon nanotubes forming the signal paths. The nature of the carbon nanotubes and the formation of such a network on such a small scale allows other advantages to be gained in certain embodiments.

For example, when disposing such networks there is often a great deal of uncontrollable random changes in the final product. In a first embodiment, random signal paths are provided in the network. As such, when particular signalling is input into the input region, output signalling will be produced at the output region, with characteristics determined by the route taken along the one or more signal paths of the network. As the paths of the network are completely random, and the route taken is entirely dependent on the physical nature of the network disposed with the substrate, it is very difficult to copy and replicate the structure responsible for providing the particular output signalling. This therefore provides what is known as a physically unclonable function. This is a device that produces a reaction signal in response to a challenge signal that, by virtue of its randomised physical design, is difficult to replicate or fake.

In other examples, such uncontrollable random variations are undesirable. However, it is still desirable to create working nanoscale networks using carbon nanotubes, as they can be used to develop nanoscale processors. The uncontrollable random path variations introduced via the manufacturing process result in different functions (e.g. AND, OR, XOR logic functions, etc) being provided by different paths within the network. These functions are affected by the electrical properties of the network. In a second embodiment, by altering these initially random electrical properties post-manufacture, it is possible to configure/reconfigure the electrical properties of existing pathways to provide a different desired function instead of their initial inherent function. This can be done via applying controlled biases to specific points in the network. In a further embodiment, a learning algorithm that 'tests' the inherent properties of the network and experiments on what biases placed where will elicit what function can enable designers to achieve desired functions from a network, despite manufacturing errors. This provides a way to 'correct', 'tweak' or 'tune' the inherent random errors introduced into such networks by virtue of their size and to control their electrical properties, or even to completely customise/tailor a network for a particular specific task or functionality.

FIG. 1a shows an isometric view of the abovementioned substrate 1 in apparatus 100 and FIG. 1b shows a top-down schematic view of said apparatus 100. This substrate 1 is the basic substrate that is used to build the first and second embodiments of the present invention. We will therefore describe this substrate 1 first before describing the other embodiments, so that its structure and inherent properties are clearly understood.

The substrate 1 comprises a plurality of carbon nanotubes 2. The nanotubes 2 define a carbon nanotube network 2. The network 2 has a number of signal paths extending throughout itself by virtue of the interconnected nanotubes within the network 2.

The network 2 is provided within the substrate 1. In this particular illustration the substrate 1 is formed from an insulating epoxy resin that has been used to seal the carbon nanotubes 2 within itself. During manufacture, the network 2 is first formed from the plurality of carbon nanotubes. These are then placed in a suitable mold and the epoxy resin is injected into the mold to engulf the network 2. Once the epoxy hardens, the substrate 1 is then formed, sealing the network 2 within the substrate 1. It is important that the substrate 1 is formed from a non-conductive insulating material to ensure that the signal paths of the network are able to function unimpeded, as well as being a material that provides structural integrity to the network 2.

It should be noted that whilst the embodiments described below are directed towards semiconducting networks utilising carbon nanotubes, the skilled person will appreciate that any semiconducting material made to form semiconducting elements on the nanoscale (i.e. nano-elements) can be utilised to form the necessary network. For example, particles may be used, as well as other types of nano-scale wires, or even small semiconducting plates could be used to implement this network. However, the following embodiments specifically focus on the carbon nanotube implementation of this network.

The skilled person will also appreciate that other variations are possible in other embodiments. For example, the substrate may also be a silicon board with the nanotubes simply placed and fixed on top of the board. In such an example, the network can be formed and affixed directly onto a silicon board or other similar prefabricated insulating substrate. In still another embodiment, the network is disposed onto the surface of a substrate and is held together by the Van der Waals force between each of the nanotubes. This force would hold the individual nanotubes together to form a network on the surface of the substrate. Therefore, when we describe the network as being disposed or provided "with" the substrate, we mean that the network can be provided "within" the substrate, or "on" the substrate, or the like.

It should be noted that in each of these examples we have described there has been one substrate. In other embodiments (not shown or further described), the network is disposed on/with a plurality (two or more) of substrates and not just one substrate.

Referring again to FIGS. 1a & 1b, the network 2 extends across and throughout the substrate 1. The arrangement of the network 2 with the substrate 1 defines an input region 3 at the left end of the substrate, and an output region 4 at the right end of the substrate (relative to FIG. 1b). The signal paths of the network extend from the input region 3 to the output region 4. In order to allow for input signalling to be provided and output signalling to be received, the nanotubes of the network 2 located near these ends can be connected electrically to input/output connections respectively. How this is accomplished will be discussed later with regard to specific embodiments.

During manufacture, the nanotubes 2 are disposed to form the network 2 such that the network is at or above what is known as the "percolation threshold" (also referred to as percolation density—$\rho_c$). FIG. 1c shows an illustration of what the percolation threshold is and how it is reached via the configuration/disposition of any given network.

For a given network, the percolation threshold is the point at which the network achieves long range connectivity. This means that when a network is at its percolation threshold, there is at least one path along which it is possible to smoothly travel from one side of the network to the other, thus providing long range connectivity in the network. Below this threshold there is typically only short range connectivity, in that there are only short paths that can be taken. These short paths do not provide a route from one side of the network to the other. Above this threshold, more paths/routes from one side of the network to the other occur, such that there are multiple routes that can be taken.

The connectivity of the network is determined by a number of factors:
(1) path length—for a particular network density, the longer each average path length is (relative to the size of the network), the closer the network will be to the percolation threshold;
(2) network density—for a particular average path length, the more paths there are per unit volume, the closer the network will be to the percolation threshold.

These factors are dependent on one another. The shorter the average path length, the higher the network density needs to be to ensure that the short paths form at least one long range connected route across the network. Similarly, the lower the network density, the longer the paths need to be in order to ensure that there is at least one long range connected route across the network.

In this particular illustration (with reference to FIGS. 1a & 1b), the percolation threshold represents the density transition point from which the system can be seen to move from a network of substantially individual carbon nanotubes, to a single connected large cluster to which nearly all of the carbon nanotubes belong. Well above this threshold, the network becomes thick and very dense. For example, for a square sample of side length L, and carbon nanotubes of length l, the percolation density $\rho_c$ is given by the formula:

$$\rho_c = N/(L/l)^2 = 5.6 \pm 0.1$$

Therefore, the threshold number of carbon nanotubes is:

$$N = 5.6 \times (L/l)^2$$

This value naturally changes when the system is not a square, but e.g. a rectangle or a circle. Also, as stated above, the length of the nanotubes as well as the length distribution of the carbon nanotubes affects the threshold.

There are at least three clear advantages in the network being at or slightly above the percolation threshold:
(1) The density variation in the carbon nanotube network is at a maximum—Well below $\rho_c$, the carbon nanotube network is not connected but consists of individual carbon nanotubes. Also, the paths from the input/source to the output/drain may not be connected. On the other hand, well above $\rho_c$, the carbon nanotube network is dense and behaves similarly from an area to another, i.e. like a bulk material. Thus the largest variation between randomly connected transistors can be achieved at the threshold.
(2) When at the threshold, there can be found so called "red" carbon nanotubes of the known "links-and-blobs" model (described in D. Stauffer and A. Aharony, Introduction to Percolation Theory (Taylor & Francis, London, 1991)). These "red" carbon nanotubes are such that neglecting or breaking one of them can essentially break the network into two parts. This is a consequence of the large density variation of the random carbon nanotube network at the $\rho_c$.
(3) In general ⅓ of carbon nanotubes are metallic and ⅔ are semiconducting—Ideally, there should not be a path following carbon nanotubes which are only metallic. This creates problems as there will be one preferred path, effectively simply providing a wire connection, rather than a network of small semiconducting wires with tunable electrical properties creating multiple path choices. The probability of metallic paths from input/source to output/drain is low at the percolation threshold, but increases above it.

It would be advantageous to configure the nanotube network such that it is substantially at the percolation threshold. By the network being "substantially at the percolation threshold", it is meant that the network density and/or nanotube lengths are such that the network is either at the percolation threshold, or slightly above it. For example, this could be by 0.01%, 0.1%, 1%, 2%, 3%, 4%, 5%, 10%, 15%, 25%, 50%, 100% or even 200% above the percolation threshold, or any combination of ranges therebetween. It should be noted that the long range connectivity effects that begin to occur at the percolation threshold can still be present in the network even when the network is at a value that is up to three times the percolation threshold value (i.e. 200% above it). Whilst these effects can still be present, it can become more difficult to tune the properties of the network, in that it can be more difficult to affect the selected signal path, and the strength of the signal path that the signalling is travelling along, from the input region to the output region than when the network is close to the percolation threshold value. Also, variations between manufactured devices, or variations between one part/region of a device to another, can decrease the further the network is from the percolation threshold. This is at least partly due to the number of possible long range connective paths increasing as the density of the network increases. This can also present a difficulty similar to point (3) above (for example, signals may pass through the network unaffected by any bias applied to effect the electrical tuning of the network).

In the substrate 1 shown in FIG. 1a, and in the following embodiments, the network 2 is configured via its disposition to be at or above the percolation threshold (as discussed above). The nanotubes 2 of the network 2 are of sufficient number and sufficient length to ensure long range connectivity from one side of the provided network to the other. This is to ensure that the network has at least one signal path that can allow signalling to be sent from one side of the network to the other along said signal paths.

Please note that the graph depicted in FIG. 1c is shown merely to illustrate the percolation threshold. This graph is not intended to accurately graph the connectivity of networks such as the present invention, since at the percolating threshold of the network the path length of signalling crossing the network would be much greater than the width of the network, since the path taken would be far from straight. This is merely to illustrate that there is a threshold point at which long range connectivity begins and the network can be treated as a fully connected network along at least one path.

Figure 1D:
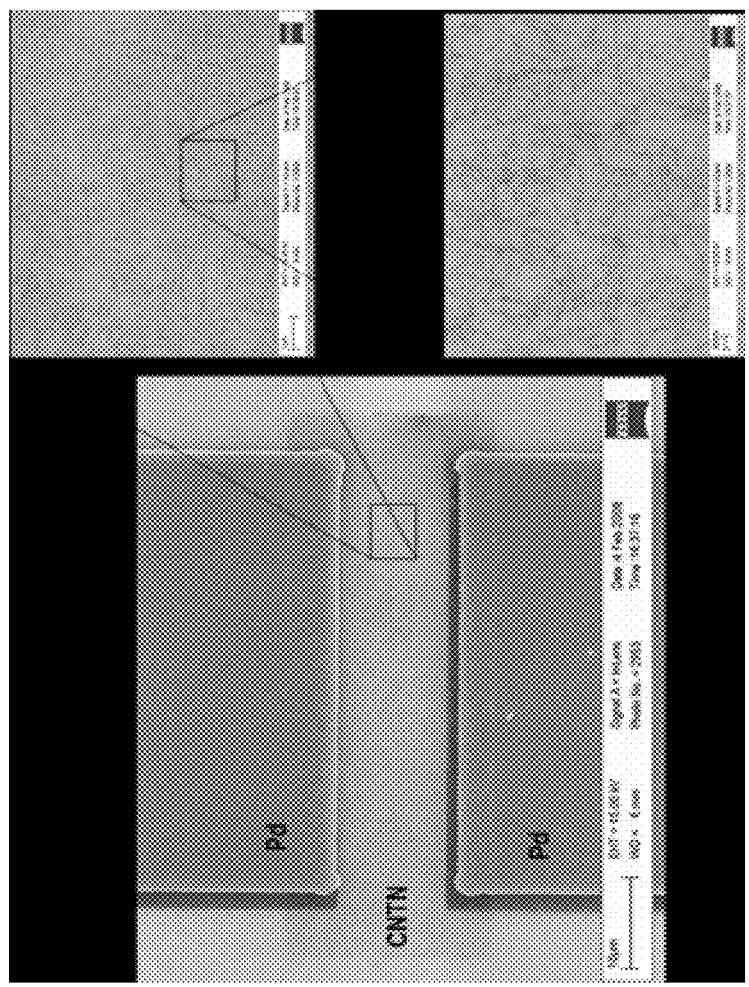

FIG. 1d illustrates a particular implementation of this carbon nanotube network in the form of a transistor. There are palladium source and drain electrodes provided (Pd—note that in this example the electrode labelling can be considered to be reciprocal, in that either electrode can the source or drain electrode), and the carbon nanotube network is disposed between them. The electrodes are both connected to the input and output regions of the network 2 to allow for input signalling to be provided and transmitted into the network 2, and to allow for output signalling to be received from the network 2 as a result of the provided input signalling.

When input signalling is applied to the source electrode, the signal will take a particular path through the network to the drain electrode. The path taken by the input signalling will affect the input signalling, thereby changing it and altering it to provide particular predefined output signalling. The output signalling is in response to the input signalling, and has characteristics that are by virtue of the disposition/arrangement of the nanotube network 2 with the substrate. Described herein are further embodiments that take advantage of the properties of such a disposed carbon nanotube network to achieve a particular technical outcome. These will now be described in more detail with reference to the figures.

Embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

We will now discuss a first embodiment of the invention utilising this substrate with reference to FIG. 2a.

This apparatus 200 of the first embodiment utilises a substrate 201 provided with a network 202 like the apparatus 100 of the first embodiment. The apparatus 200 also comprises input connections 203b and output connections 204b. In this particular embodiment, these connections 203b, 204b are short terminal pins that are to be inserted into the setting epoxy resin forming the substrate 201 during the manufacturing stage of the apparatus 200. The input connections 203b are to be electrically connected to the nanotubes 202 located near the input region 203, and the output connections 204b are to be electrically connected to nanotubes 202 located near the output region 204. The skilled person will also appreciate that other variations are within the scope of the present invention. For example, the connections 203b, 204b may be conductive tracks laid down on a silicon board that the network is to be disposed on, the conductive tracks to be electrically connected to the nanotubes of the respective regions 203, 204. In other variations, the nanotubes located near the input/output regions are actually exposed from the substrate to allow the connections/terminals 203b, 204b to simply be electrically connected to the exposed nanotubes without the need for insertion of such terminals into the setting epoxy resin substrate 201.

As in apparatus 100, the network 202 is again configured to be at or above the percolation threshold for this network to achieve long range connectivity across the network 202. The substrate 201 is similarly formed from an epoxy resin, and the network 202 is disposed randomly within the epoxy resin substrate 201 during manufacture.

During manufacture, the input and output connections 203b, 204b are inserted into the respective input and output regions 203, 204 during setting of the epoxy resin. They are inserted such that they are in electrical communication with the nanotubes of the network 202 located near the input/output regions 203/204. The electrically connected input connections 203b allow for input signalling to be provided via the input region to the signal paths of the network 202. Similarly, the electrically connected output connections 204b allow for any output signalling coming from the network to be outputted to further devices.

A signal provider (not shown) such as an oscilloscope, computer/CPU, input antenna, or the like (i.e. anything that can provide an electrical output to provide for input signalling) can be connected to the input connections 203b to provide such signalling. A separate output device (not shown) such as an oscilloscope, computer/CPU, output antenna, or the like can also be connected to the output connections 204b to allow for output signalling to be taken from the network 202 and provide an output. This can enable the apparatus to act as a sensing apparatus, a pattern recognition apparatus, a data classification apparatus, etc.

We will now describe the inner function of this apparatus.

As the input connections 203b are electrically connected to the carbon nanotubes of the network 202, the input signalling is transmitted across the network 202 by virtue of the network 202 being at/above the percolation threshold. The network 202 will have an effect on the provided input signalling due to its inherent electrical properties. The exact effect that the network 202 has on the signalling is dependent on these electrical properties. These properties are, in turn, heavily dependent on the physical arrangement of the nanotubes within the network 202 and the network 202 itself. By arranging the network 202 randomly during the manufacturing stage, the exact result that the network 202 will have on the input signalling will also be entirely random and therefore unique to that particular network 202.

This apparatus 200 can therefore be seen to provide a device that will produce particular output signalling in response to particular input signalling. This output signalling will be predefined according to the uniquely random disposition and arrangement of the network 202 and its signal paths. The unique response characteristics of the network 202 are difficult to replicate by virtue of its randomised arrangement, as well as the fact it is on a size scale that is difficult to examine. The scale on which the network 202 has been manufactured also makes it exceedingly difficult to accurately reproduce exact copies of known apparatus without erroneous or failed results. This provides what is known as a physically unclonable function: a device/apparatus that operates on a given input signal (termed a 'challenge' signal) to provide a particular corresponding and predefined output signal (termed a 'response' signal) that is dependent on its physical attributes, but that is also difficult to replicate (hence the term 'unclonable').

Therefore, this apparatus can be used to uniquely identify objects in a secure fashion. For example, for a given apparatus receiving known input signalling, the output signalling given out in response to the input will be known. It is therefore easy to identify a particular apparatus by evaluating such output signalling produced in response to input signalling. This makes it easy to evaluate the identity of apparatus/devices, and whether they are fake or genuine. This is a secure method, as the apparatus is very difficult to forge due its small scale and randomised arrangement.

In a variation of this embodiment, the apparatus 200 is implemented as a transistor (as per FIG. 1d), with the input connections 203b acting as a source electrode, and the output connections 204b acting as a drain electrode. The network 202 and substrate 201 act as the semiconductor material sandwiched between the source and drain electrodes as per normal transistor design.

We will now describe a further variation on this embodiment with reference to FIG. 2b. In this embodiment, the apparatus 210 is implemented in a transistor, specifically a cross-bar structure transistor. A crossbar structure transistor utilises a signal path crossed by two control lines, separated by a switchable junction (typically on the nanoscale). Such a structure provides a matrix of carbon nanotube Field Effect Transistors (FET). Each of these can be individually addressed, or they can be addressed in groups.

In this embodiment, the apparatus 210 comprises the network and substrate as in apparatus 100 of the first embodiment. However, the input and output regions 213, 214 are both positioned on the top surface of the network/substrate.

The apparatus 210 also comprises an insulator 217d (specifically an insulating layer), source electrodes 213b (individually referred to as Se1 ... n), drain electrodes 214b (individually referred to as De1 ... n) and gate electrodes 216 (individually referred to as Ge1 ... n). The apparatus further comprises a processor (not shown) connected to the gates 216 and a power source (not shown). The processor is configured to control the application of a bias to one or more of the gates 216 to select specific cross-points within the transistor.

In this embodiment, the insulator 217d is a preformed silicon wafer. In other embodiments it is a chemically deposited insulating material, such as a carbon based epoxy. In still other embodiments, it is an epoxy resin that can be applied and left to set during manufacture. The skilled person will appreciate that there are other alternatives that are also within the scope of this invention.

The source, drain and gate electrodes 213b, 214b, 216 are, in this embodiment, formed from gold strands, but the skilled person will appreciate that they can be formed from any electrically conductive material suitable for such a cross-bar transistor architecture. For example, silver, copper, palladium, or even meshes of graphene or weaves of carbon nanotubes.

The source and drain electrodes 213b, 214b are to be electrically connected to the nanotubes of the network 212 as per the input/output connections 203b, 204b of the apparatus 200 of the first embodiment. As they are separate strands they are capable of providing substantially separate input and output connections to the plurality of signal paths of the network 212.

As in apparatus 100, the network 212 is again configured to be at or above the percolation threshold for this network to achieve long range connectivity throughout the network 212. The substrate 211 is similarly formed from an epoxy resin, and the network 212 is disposed randomly within the epoxy resin substrate 211 during manufacture.

The source and drain electrodes 213b, 214b are electrochemically deposited onto the network/substrate 201, 202 arrangement so as to be electrically connected to the network 212 via the input/output regions 213, 214 positioned on top of the network/substrate 201, 202.

The insulating layer 217d is deposited on top of the source and drain electrodes 213b, 214b.

Finally, the gate electrodes 216 and deposited on top of the insulating layer 217d. This forms the sandwiched cross-bar structure transistor of this embodiment.

We will now describe the functionality of this embodiment.

This architecture configures the nanotube network 212 to be a network of FETs that are each individually addressable via the separate input output connections of the source and drain electrodes 213b, 214b and the plurality of gate electrodes 216. This is specifically achieved by applying a bias to one or more of the gates Ge1 ... n. When such a bias is applied, certain paths are selected within the network 212, and their corresponding input/output connections (via source and drain electrodes 213b, 214b/corresponding gates Se1 ... n & De1 ... n) are also selected. The configuration of the connected processor allows it to apply such a controlled bias to specific gates 216. This opens up specific pathways within the transistor network. Therefore, the application of a controlled bias allows the selection of specific cross-points of the network 212, formed by the gates 216 and the source and drain electrodes 213b, 214b within the transistor. Note that the insulating layer 217d is necessary so that the applied bias is not directly electrically conducted to the source and drain electrodes 213b, 214b.

By implementing the first embodiment in this way, it is possible to provide a network of FETs that can be individually addressed in a number of different ways. For example, each FET could be addressed as an individual transistor, or smaller sub-groups could be formed, or specific patterns could be selected from within the network 212. By controlling the specific application of bias across the gate electrodes 216, it is possible to configure this apparatus 210 to provide a number of different response signals in reaction to a number of different challenge signals (as per the challenge-response pairs discussed above).

The network provides a challenge-response area with a large space for receiving challenges. The number of challenges that can be received is influenced by the number of gate electrodes provided. The number of possible challenges is:

$$\text{Number of challenges} = m \times 2n;$$

n—number of gate electrodes
m—number of parameter levels measured

For example, the resistance of each signal path and/or source-drain current via the transistor at fixed gate voltage and/or any other transistor parameter can be used as informative parameters in response to signalling that can be input via the abovementioned electrodes.

The challenge-response pairs can therefore be seen to correspond to the transistor parameters. For example, gate electrode ($V_g$) and source-drain ($L_{sd}$) can be linked such that there are characteristic pairs for every manufactured apparatus, in that a given apparatus has multiple, measurable $V_g$-$L_{sd}$ pairs that are sufficiently different from every other apparatus such that each device can be considered to have a unique "fingerprint".

Figure 2C:
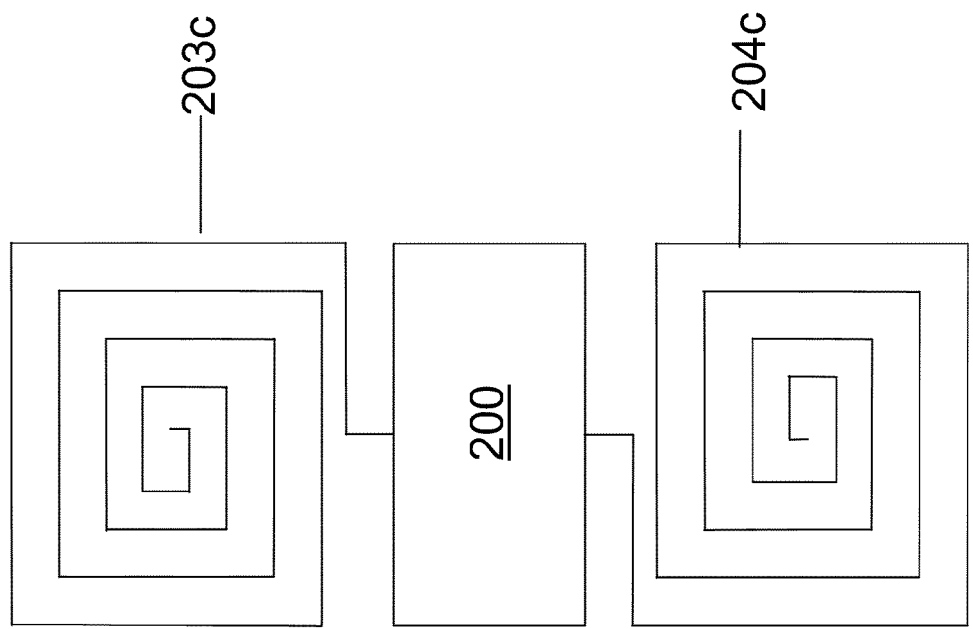
FIG. 2c shows a further variation of the first embodiment utilised in a radio frequency identification (RFID) tag.

In a further variation of the first embodiment, the apparatus 200 is implemented in a radio frequency identification (RFID) tag (see FIG. 2c). This embodiment comprises apparatus 200, and also input and output antennas 203c, 204c. The input antenna 203c is to be electrically connected to the nanotubes of the network 202 via input connections 203b. The input antenna 203c is also configured to be capable of receiving incoming electromagnetic radiation via electromagnetic induction and providing it to the network 202. The output antenna 204c is to be electrically connected to the nanotubes of the network via output connections 204b. The output antenna 204c is also configured to be capable of translating output signalling from the network 202 into equivalent emitted electromagnetic radiation.

The RFID tag is assembled by electrically connecting the input and output antennas to the input and output connections 203b, 204b respectively.

The input antenna 203c, when receiving an incoming electromagnetic signal, will produce and provide input signalling to the input connections 203b and thereby to the network 202 via electromagnetic induction. The network 202, by virtue of its random disposition, will produce particular predefined output signalling at the output region 204. This output signalling is then communicated via the connected output connections 204b to the electrically connected output antenna 204c. The output antenna will then emit an output electromagnetic signal in accordance with the output signalling provided by the network 202.

This arrangement provides an RFID tag that can produce a unique output response to an input challenge electromagnetic radiation signal. This can be utilised in commercial goods, store goods, shipping containers, shipping pallets, electronics, identification cards, etc, to produce RFID tags that have unique characteristics that can be easily evaluated and used for identification purposes, but not easily forged. In this embodiment the RFID tag is passive, but in other embodiments the tag is active, and in others semi-passive.

The above embodiments can be used for components in low cost electronics. The carbon nanotube networks can even be placed on various substrates, including flexible or transparent substrates.

The physically unclonable function provided by the carbon nanotube network can be easily integrated with electronic circuits, particularly low cost circuits that are already made of carbon nanotube networks. Furthermore, once it is integrated with other circuitry it can be read electronically. For example, as a part of an RFID tag (as in the embodiment immediately above) it can be read using RF signals. This would help provide RFID tags that are difficult, or even impossible to forge. In still other examples, this concept could be implemented in devices that would utilise other types of reading equipment, e.g. optical inspection, lasers etc. to identify the unique characteristics of the network.

Figure 3A:
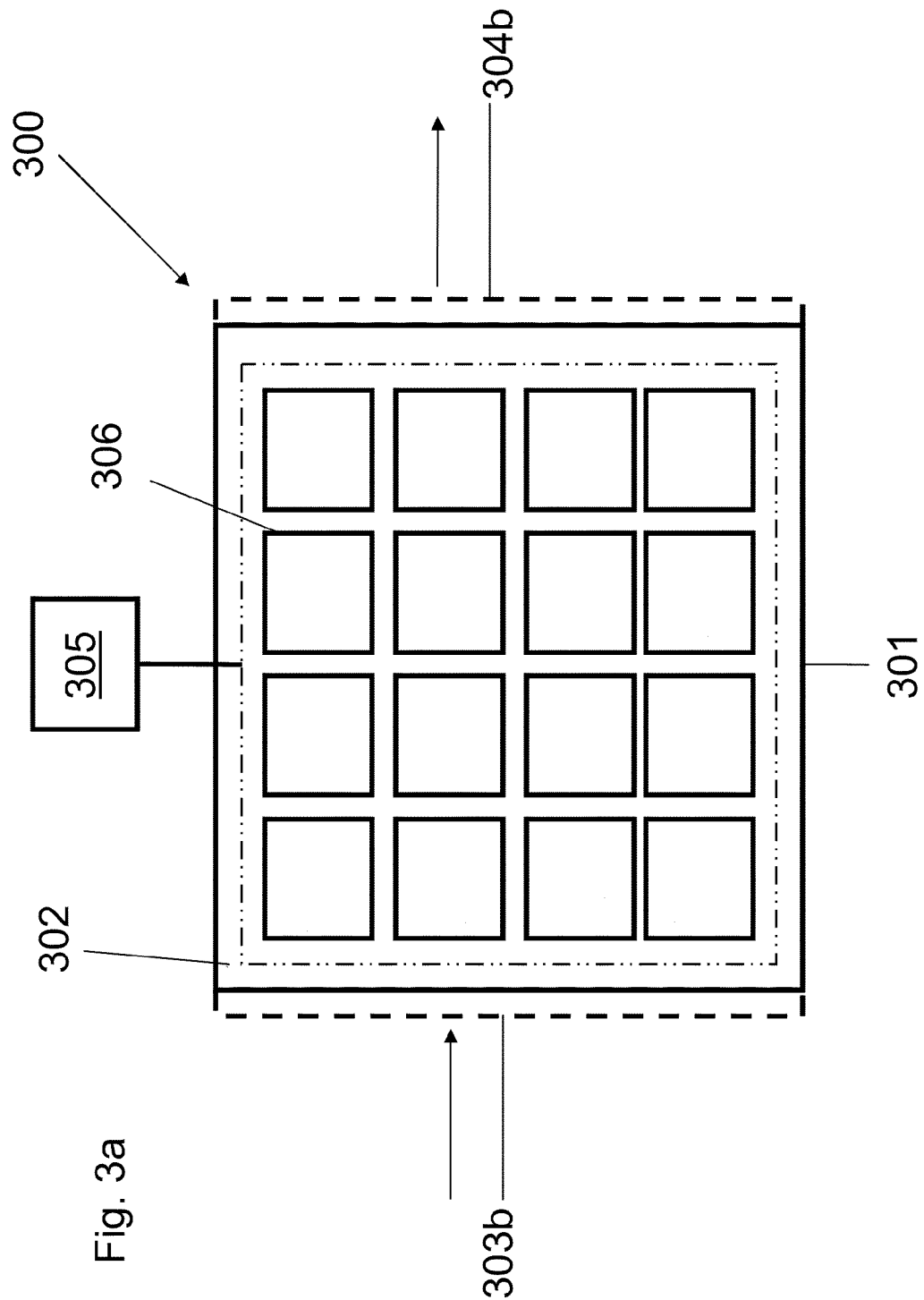

We will now describe a second embodiment of the present invention with reference to FIG. 3a. This embodiment provides an apparatus 300 that utilises and builds on the apparatus 200 according to FIG. 2a. The apparatus 300 also comprises gates 306 and processor 305.

The gates 306 are small metallic plates (on the micro-scale or nano-scale) that are capable of receiving an applied charge or bias in response to a control signal. The gates 306 are capable of setting up their own corresponding electric field in response to such an applied bias. The processor 305 is an integrated circuit (IC) chip that is capable of providing such a control signal to the gates 306 to apply a particular charge or bias.

The gates 306 are provided on the top surface of the network 302 with the substrate 301. The gates 306 are configured to be in electrical communication with the nanotubes of the network 302, but they are not in direct electrical contact with the nanotubes of the network 302. The gates 306 are also all electrically connected to the processor 305 so that the processor can apply the controlled biases to particular gates.

In another variation of this embodiment the substrate is doped and also connected to the processor such that it can also act as a gate, specifically a global gate. This allows the processor to bias the entire substrate and thereby bias the entire network (not just local biasing as provided by the individual gates).

In this embodiment the processor 305 is positioned adjacent to the network/substrate 301, 302 arrangement whilst still remaining electrically connected to the gates 306. The processor 305 is also electrically connected to input and output regions/connections 303/303b, 304/304b, to a power source (not shown), and to a memory (not shown).

We will now describe the functionality of this embodiment.

As discussed above, the network 302 will have an effect on provided input signalling because of its inherent electrical properties. The exact effect that the network 302 has on the signalling is dependent on these electrical properties. By altering these electrical properties, it is possible to 'fine-tune' or 'tweak' these properties.

The processor 305 is configured such that it can provide a controlled bias to the gates 306. The positioning of the gates 306 over the network 302 means that when they experience an applied/controlled bias, they set up an electric field that affects/alters the electrical properties of the network 302 in that locality. By altering these electrical properties, the effect of the network 302 on the input signalling can be altered by using this method.

For example, the network 302 may have a specific function in a particular locality (in its unbiased state, e.g. an OR function). Normally, when a signal passes through this locality, it is acted on by this function. In this example, we desire an AND logic function. By applying a particular predetermined bias to a particular gate overlying that locality, the electrical properties of the network 302 can be altered to force that OR function acting on the signalling to become an AND function. This may be achieved by recruiting other signal paths, or forcing the flow of charge along a certain path, or preventing a particular signal path from being taken by the signalling, etc.

As another example, the desired functionality of the network 302 may require that a particular locality be switched between the above OR function and the above AND function in certain situations. By application and removal of the applied bias, the function can easily be changed back and forth between the two functions.

As another example, the desired functionality of the network may require that the same locality be switched between a further third logic function, e.g. XOR, NOR, etc. This can also be achieved by applying a further, different predetermined bias to a particular gate 306 to alter the electrical properties of the network 302 accordingly, in that a particular function can be changed from a first function (e.g. OR) to a second function (e.g. AND) and onto a third function (e.g. XOR). The gates may even provide for four, five, six, seven or more functions to be selected in a particular locality by way of an applied bias.

As another example, it may be desirable for the network to provide a particular analog function, i.e. acting as a mathematical operator or providing a mathematical function to provide output signalling in response to input signalling in accordance with the mathematical function. This can enable the apparatus to be used to process analog signals and not just digital signals (as in the examples utilising logic functions). This functionality can enable the apparatus to be used, for example, as a data classification apparatus, which can receive provided signalling and identify, rank, order, compare, etc components of the signalling or signals of the signalling in order to classify them.

The skilled person will appreciate that by application of specific predetermined biases to gates 306 in specific localities, it is possible to alter a network 302 to achieve a desired overall functionality. The processor can bias the localised areas of the network to provide any one or more of these logical or analog functions, or any one or more of them in combination. For example, the network can be tuned to achieve a functionality that is suitable for a particular task, e.g. calculator chip, timing chip, half-adder, pattern recognition or data classification device. This could be an application specific integrated circuit provided in a particular device. Also, by virtue of its size, this apparatus could also be a nano-scale processor.

Figure 3B:
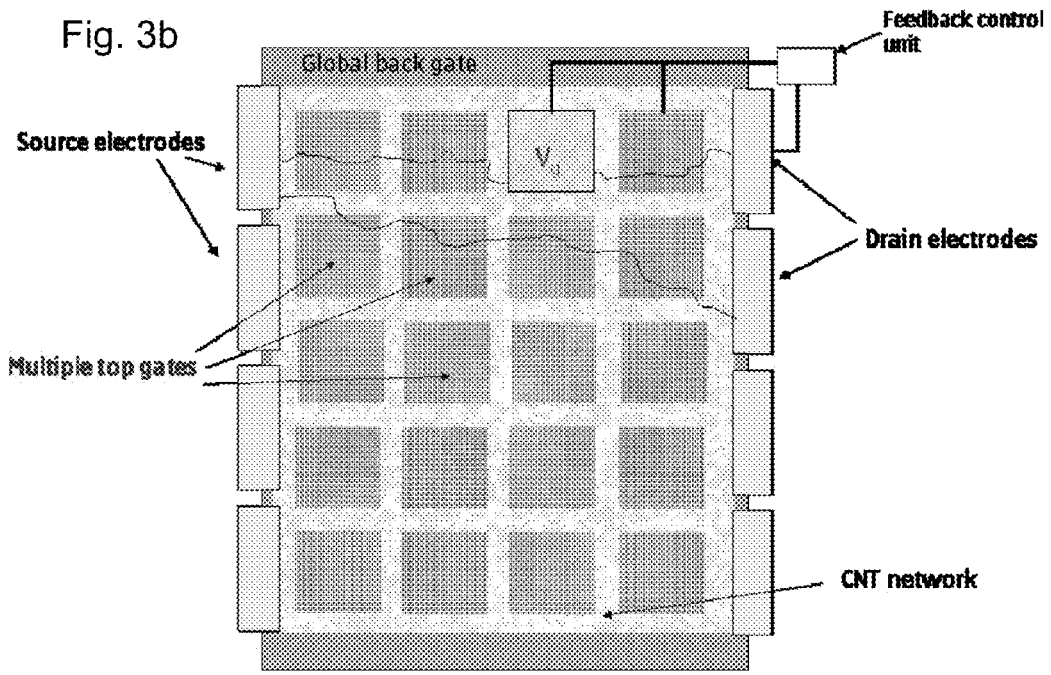
FIG. 3b shows an illustration of active paths across the network in the second embodiment.
Figure 3C:
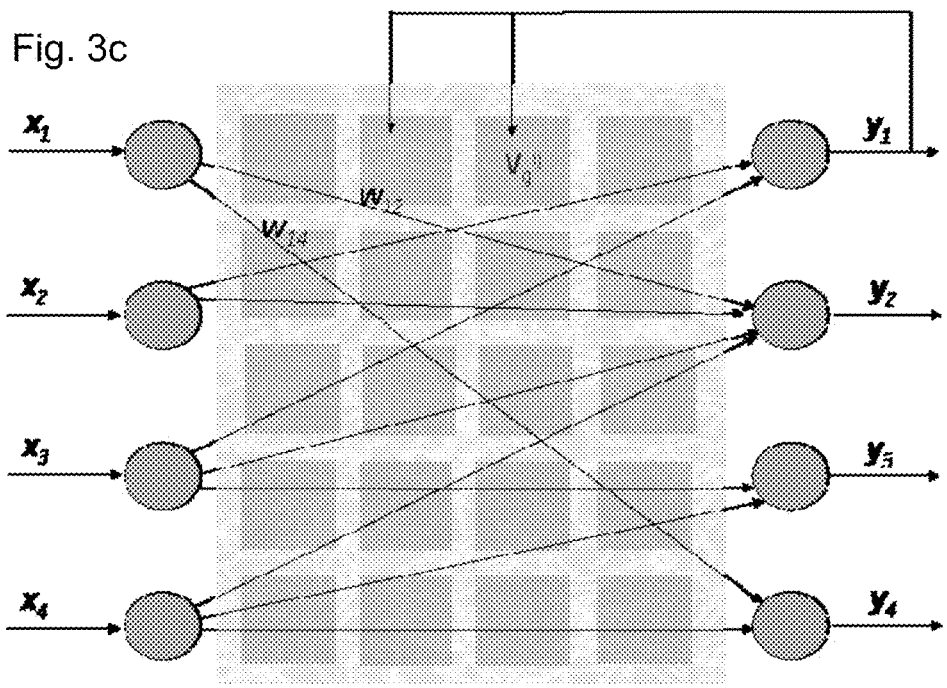
FIG. 3c shows a representation of the mapping of the logical structure (or the computational model) of the apparatus and paths through the physical network of the second embodiment.

FIGS. 3c & 3d show alternative ways of expressing/representing the logical structures provided by the carbon nanotube networks of the second embodiment. Here, the logical network does not necessarily correspond directly to the physical network structures of the device, but describes the computational model behind the operation of the device. In the computational model, the input and output signalling correspond to one another by a predetermined relationship. This relationship is predetermined according to the physical and electrical properties of the actual network, which can be tuned by applying the bias voltages to the local or global gates. In these figures (particularly FIG. 3d) the true physical connectivity of the network is modelled more accurately, with internal nodes (i.e. internal junction or switching points controlled via the gates) also being shown. The connections between internal nodes can be tuned by applying a bias or voltage to respective gates (i.e. local or global gates). In practice, there will be a large number of internal node connections (connections between nanowires provided by the nanotubes). As such, using this type model to represent the network can become extremely complex, but can allow for more accurate modelling of the operation of such a system.

Figure 3E:
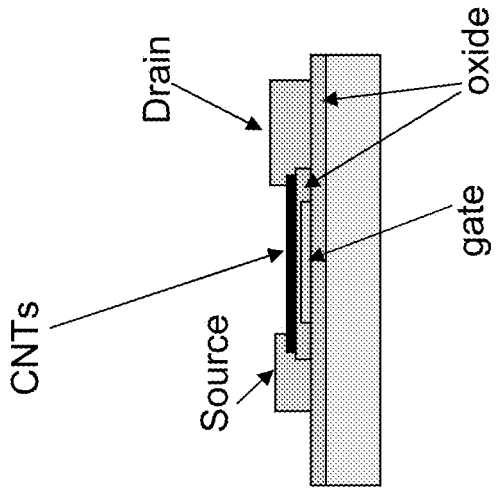
FIGS. 3e & 3f show side views of alternative methods of laying the carbon nanotube network on the substrate in the first and second embodiments.
Figure 3F:
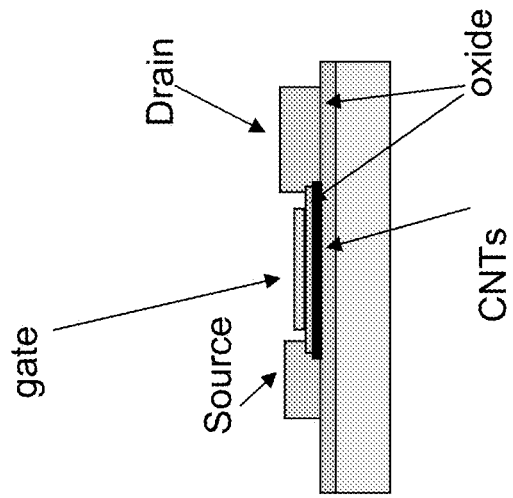

FIGS. 3e & 3f show alternate ways of disposing the structure of the second embodiment (or variations of the second, or even variations of the first) on a substrate. FIG. 3e shows one way of disposing the network onto the substrate followed by the gates, whilst FIG. 3f shows another way of disposing the gates first (to form 'back' gates rather than 'top' gates) and then the network onto the gates.

Figure 3G:
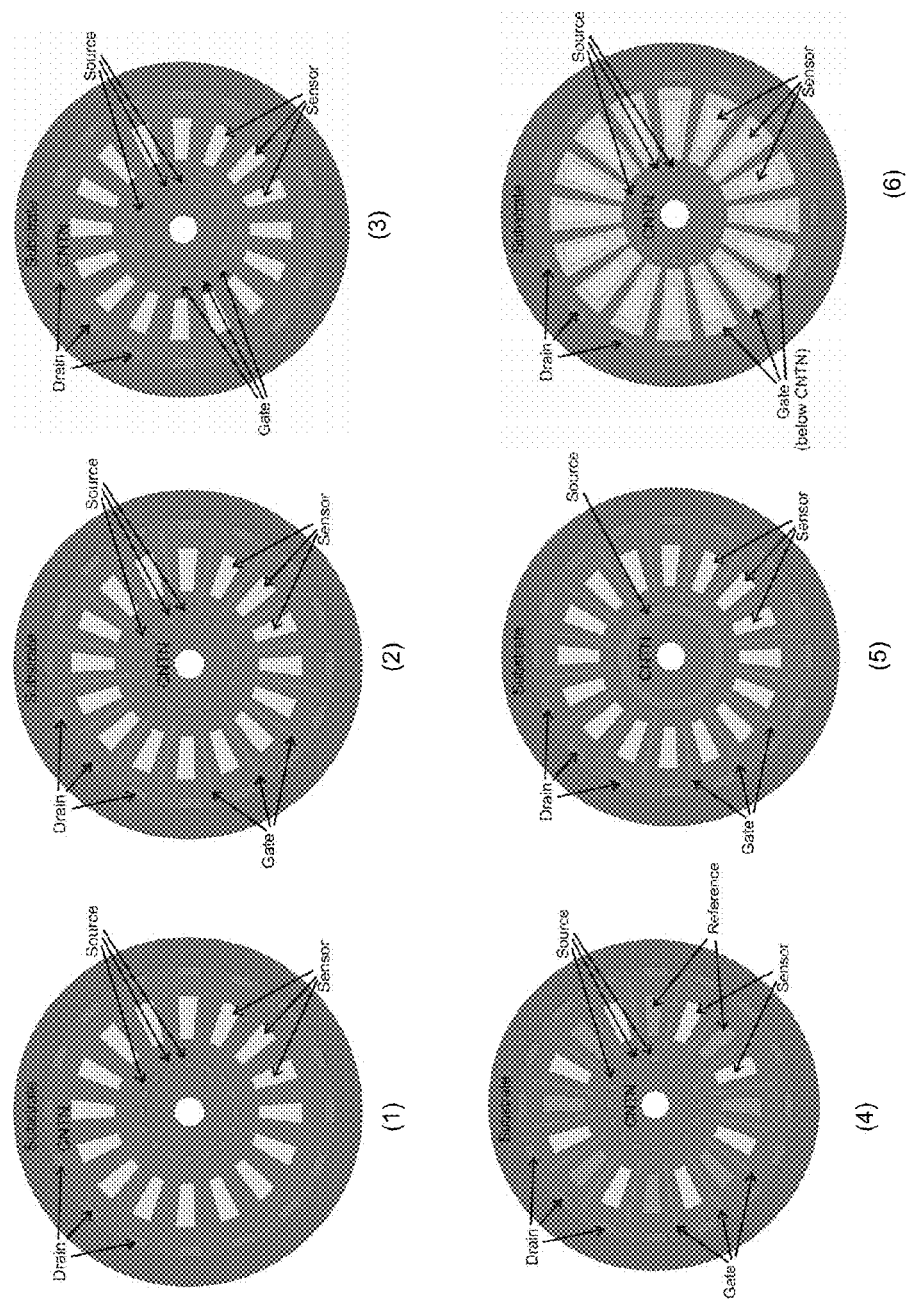
FIG. 3g shows an example of how to create variations of the first and second embodiments in a circular architecture.

FIG. 3g is provided to illustrate that other types of geometric architecture are possible for the embodiments of the present invention, for both the first and second embodiments. This particular figure illustrates how the various embodiments described herein could be provided in a circular structure. Other types of architecture are also possible and within the scope of the application, such as triangles, ellipses, quadrilaterals, regular polygons as well as irregular polygons, and even multi-layered devices via stacking. The skilled person will appreciate that many architectural variations for implementing these embodiments are within the scope of this application.

Different types of these, for example, circular geometries can be used either separately or in combination. FIG. 3g illustrates some of these possibilities:

(1) A carbon nanotube network above a substrate, equal number of sources and drains and sensors in between.
(2) Gates between source-drain pairs and sensors.
(3) This type is similar to (2) but with a slightly different geometry. A combination of (b) and (c) can be used or extended.
(4) This utilises sensors of different types, or uses some of them as a reference when the sensor does not work with an absolute value but with relative terms.
(5) In this example a single source can be used for all drain electrodes.
(6) The gates can be back gates that are positioned below CNTN (see FIGS. 3e & 3f).

In the present second embodiment, the random disposition of the network 302 means that the network initially has unknown paths and unknown functions inherent within its structure. These will affect input signalling in an initially known way. In order to determine the necessary bias that should be applied to each of the gates 306, the inherent functions of the network 302 must be identified. In this situation, it can be beneficial to use a learning algorithm.

In a variation of the second embodiment, the processor 305 is also provided with such a learning algorithm. This learning algorithm is configured to identify the inherent functionality of the initially disposed network 302. It is capable of controlling the biases to be applied to the gates 306. We will now describe the functionality of the learning algorithm with reference to FIG. 4.

Step 401: As stated above, the processor 305 is electrically connected to the input connections 303b, the output connections 304b, and the gates 306. The learning algorithm can therefore be run on the processor 305 to provide input signalling to the input connections 303b and test the corresponding output signalling via the output connections 304b. The output signalling can be compared to the input signalling to thereby identify the functions and/or operations provided by the network 302. The resulting determinations can then be stored in the connected memory (not shown). For example, a reference table may be stored in the memory identifying the localities in the network 302 having particular functions. The inherent functionality of the network 302 is thereby recorded in the connected memory.

Step 402: Once this has been done, the learning algorithm calculates the bias that would be needed to be applied to particular localities to provide a particular function. The provision of a new function via the applied bias may be by configuration/reconfiguration of the function already provided by that locality, or it may provide a new function where previously there was no specific function (e.g. reconfiguration of a path that simply allows signals to pass through unaffected, or a path that simply does not allow signals to pass, etc). This information regarding appropriate biases that can be applied, where they are to be applied, and what function they achieve is then stored in the memory. For example, a further reference table can be stored in which the bias needed to achieve particular functions in particular localities is recorded, or the initial table may have such information appended to it.

Step 403: Once this has been done, the processor 305 can utilise the stored information to selectively apply particular biases to provide specific/desired functions throughout the network. For example, in FIG. 3b, a bias applied to one of the top gates can thereby tune the corresponding locality of the nanotube network 302 so that it becomes insulating, and thus blocking path(s) from source to drain electrodes 303, 304. The processor can also alter/tune the resistivity of localities within the network to thereby change and control how the network affects signalling passing through it, (e.g. such that only part of the input signalling will be able to reach the output region).

The skilled person will appreciate that these steps may also be performed simultaneously or temporally overlapping, as well as being performed in sequence. They may even be performed out of sequence depending on the starting knowledge of the paths of the network 302.

FIG. 3c is a logical representation of the operation of the apparatus in the second embodiment. The electrical properties of the connections and the 'weights' of the paths taken between the input and output regions can be altered by changing the top gate voltages, or they may put even put to zero. The original connectivity of the network is defined by the physical properties of the initially manufactured apparatus, but these properties can be tuned by applying controlled signals (e.g. applied bias, or voltages). The feedback loops from the output lines to the voltages are used, at least in this learning algorithm embodiment, for teaching the system or even unsupervised learning. Using this method, it is possible to take an apparatus having a completely randomised network structure (as per the above embodiments) and, via the described learning algorithm and gates 306, tune its properties to transform the network from an initial state to a different state having a desired functionality.

Suitable algorithms can be based on Bayesian networks, or may include aspects of pattern recognition, data classification, regression analysis and optimization problems.

There are many advantages to this embodiment. As the network is totally random, it is possible to achieve this embodiment without using a cross-bar structure. Furthermore, providing a randomised network structure is very easy in comparison to trying to make a specific network structure. As such, utilising random manufacturing for these embodiments is a particularly easy and cost effective method.

Also, since in some embodiments the system will be taught specific functionality post-manufacture, it is easier to ensure that such apparatus will be robust against manufacturing defects or variations, which are inherent in any nanoscale fabrication process.

In some embodiments, as the apparatus is taught to have and tuned to a certain functionality, the apparatus will be very efficient for solving certain types of computational problems when compared to a similar or equivalent CMOS implementation of identical algorithms. It is also capable of acting as an analog device with high speed, being limited only by the switching time of the transistors. It can also have very low energy consumption.

Due to the achievable size of these apparatus, a large amount of connections can be achieved in a very small area. This can lead to enhanced computing capabilities of such networks. The more connections one can make, the more complex problems can be solved.

Tuning is done electrically by applying gate voltages, without changing the physical structure, only its electrical properties. Therefore, it is more reliable than correcting physical network issues by the use of solvents or the like.

Furthermore, the apparatus is particularly well suited to solving and analyzing sensory data (for example, chemical analysis and identification).

The method of manufacture can also be done in one step, via disposition of a network on a known substrate, or sealing within a resin, or the like. It is therefore a highly efficient method of creating such structures.

Shown in FIG. 5 is a method of assembly of the apparatus of FIGS. 1a & 1b. The method involves disposing the plurality of carbon nanotubes with said substrate to define the carbon nanotube network. The nanotubes are disposed such that the network is substantially at its percolation threshold. As a result, the percolation threshold provides for the one or more signal paths extending from the input region to the output region. See step 501. In particular, it is the lengths of the carbon nanotubes and the density of the network that are configured such that the network is substantially at the percolation threshold.

This method also forms the basis for constructing the first and second embodiments, as well as variations thereon.

Figure 6:
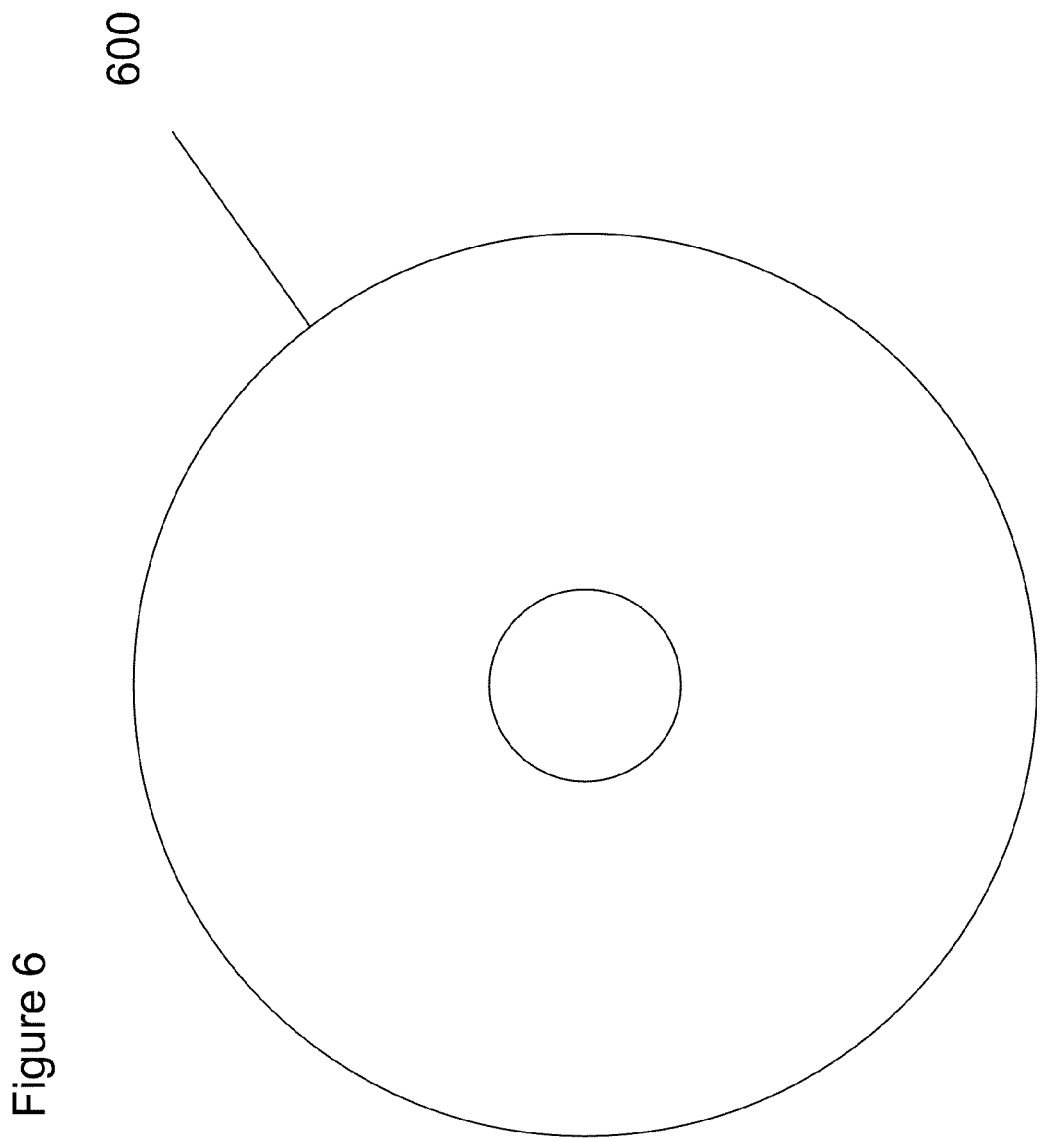
FIG. 6 illustrates schematically a computer readable media providing a program according to an embodiment of the present invention.

FIG. 6 illustrates schematically a computer/processor readable media 600 providing a program according to the learning algorithm embodiment of the present invention. In this example, the computer/processor readable media is a disc such as a digital versatile disc (DVD) or a compact disc (CD). In other embodiments, the computer readable media may be any media that has been programmed in such a way as to carry out an inventive function.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising: a substrate; a plurality of carbon nanotubes disposed and fixed with said substrate to define a carbon nanotube network at the percolation threshold of the network, wherein the percolation threshold provides for one or more paths extending from an input region to an output region of the network, wherein the carbon nanotubes are disposed randomly on said substrate to define said network, the apparatus being configured to, upon receiving particular input signalling via the input region, provide particular predefined output signalling at the output via the one or more signal paths, the particular output signalling being predefined according to the one or more one signal paths, wherein the particular predefined output signalling comprises unique output signaling provided by virtue of the random distribution of the carbon nanotube network and wherein the apparatus is configured as a physically unclonable function provided by virtue of the random distribution of the carbon nanotube network.

2. An apparatus as claimed in claim 1, wherein the apparatus further comprises one or more gates configured to be in electrical communication with the carbon nanotube network disposed on the substrate, the apparatus also being configured to be capable of applying bias to one or more of said gates to alter the electrical properties of the carbon nanotube network to provide particular predefined output signalling according to the respective bias applied to one or more of the gates.

3. The apparatus as claimed in claim 1, wherein the apparatus further comprises one or more input connections and one or more output connections, the input and output connections each being respectively configured to be in electrical communication with the input and output regions of the carbon nanotube network, the one or more signal paths of the network being configured to extend between respective input connections and corresponding output connections, the apparatus being configured to, upon receiving particular input signalling via one or more of the input connections, provide particular predefined output signalling at one or more of the corresponding output connections connected via the one or more signal paths, the particular output signalling being predefined according to the one or more signal paths connecting the respective input connections and corresponding output connections.

4. The apparatus as claimed in claim 3, wherein one or more of the signal paths are respectively configured to provide one or more corresponding functions, the particular output signalling being predefined according to the one or more functions provided by the one or more respective signal paths.

5. The apparatus as claimed in claim 2, wherein the apparatus is also configured to be capable of applying bias to one or more of said gates to alter the electrical properties of the carbon nanotube network to thereby configure/reconfigure one or more paths to provide one or more respective functions, the particular predefined output signalling being predefined according to the one or more provided/reconfigured functions.

6. The apparatus as claimed in claim 5, wherein the apparatus is further configured to be capable of selectively switching/altering the bias applied to anyone or more of the gates to cause the function provided by anyone or more of the corresponding signal paths to be switched from a first function to a second function, wherein the second function is different from the first function.

7. A method for assembling an apparatus, the apparatus comprising: a substrate; a plurality of carbon nanotubes disposed and fixed with said substrate to define a carbon nanotube network at the percolation threshold of the network, wherein the percolation threshold provides for one or more paths extending from an input region to an output region of the network, wherein the carbon nanotubes are disposed randomly on said substrate to define said network, the apparatus being configured to, upon receiving particular input signalling via the input region, provide particular predefined output signalling at the output via the one or more signal paths, the particular output signalling being predefined according to the one or more one signal paths, wherein the particular predefined output signalling comprises unique output signaling provided by virtue of the random distribution of the carbon nanotube network and wherein the apparatus is configured as a physically unclonable function provided by virtue of the random distribution of the carbon nanotube network, wherein the method comprises: randomly disposing the plurality of the carbon nanotubes with the substrate such that the network is substantially at its percolation threshold, the percolation threshold thereby providing for the one or more paths extending from the input region to the output region.

8. A method for configuring an apparatus, the apparatus comprising: a substrate; a plurality of carbon nanotubes disposed and fixed with said substrate to define a carbon nanotube network at the percolation threshold of the network, wherein the percolation threshold provides for one or more paths extending from an input region to an output region, wherein the carbon nanotubes are disposed randomly on said substrate to define said network, the apparatus being configured to, upon receiving particular input signalling via the input region, provide particular predefined output signalling at the output via the one or more signal paths, the particular output signalling being predefined according to the one or more one signal paths, wherein the particular predefined output signalling comprises unique output signaling provided by virtue of the random distribution of the carbon nanotube network and wherein the apparatus is configured as a physically unclonable function provided by virtue of the random distribution of the carbon nanotube network; wherein the method comprises: detecting functions provided by one or more signal paths of the network, calculating the applied bias needed to provide/configure/reconfigure one or more of the signal paths to provide one or more desired functions, and applying the necessary bias to the corresponding gates to configure the respective one or more signal paths to provide the one or more desired functions.

9. A computer readable storage medium comprising computer code configured to perform the method of claim 8, when run on a processor comprised by the apparatus.

10. An apparatus comprising: a substrate; a plurality of semiconducting nano-elements disposed and fixed with said substrate to define a semiconducting network of nano-elements at the percolation threshold of the network, wherein the percolation threshold provides for one or more paths extending from an input region to an output region of the network, wherein nano-elements are disposed randomly on said substrate to define said network, the apparatus being configured to, upon receiving particular input signalling via the input region, provide particular predefined output signalling at the output via the one or more signal paths, the particular output signalling being predefined according to the one or more one signal paths, wherein the particular predefined output signalling comprises unique output signaling provided by virtue of the random distribution of the nano-elements network and wherein the apparatus is configured as a physically unclonable function provided by virtue of the random distribution of the nano-elements network.

* * * * *